United States Patent [19]

Steele et al.

[11] Patent Number: 4,937,791
[45] Date of Patent: Jun. 26, 1990

[54] HIGH PERFORMANCE DYNAMIC RAM INTERFACE

[75] Inventors: Craig S. Steele, Pasadena, Calif.; William C. Athas, Jr., Sandy, Utah; Charles L. Seitz, San Luis Rey, Calif.

[73] Assignee: The California Institute of Technology, Pasadena, Calif.

[21] Appl. No.: 201,430

[22] Filed: Jun. 2, 1988

[51] Int. Cl.$^5$ .................... G11C 8/00; G06F 13/00
[52] U.S. Cl. ............... 365/230.03; 364/249; 364/252; 364/954; 364/959.1; 365/230.01
[58] Field of Search ... 364/200 MS File, 900 MS File; 365/235, 230

[56] References Cited

U.S. PATENT DOCUMENTS

| | | | |
|---|---|---|---|
| 4,368,515 | 1/1983 | Nielsen | 364/200 |
| 4,550,368 | 10/1985 | Beechtalsheim | 364/200 |
| 4,623,986 | 11/1986 | Chauvel | 364/900 |
| 4,802,135 | 1/1989 | Shinoda et al. | 365/230 |
| 4,803,621 | 2/1989 | Kelly | 365/230 |

Primary Examiner—Gareth D. Shaw
Assistant Examiner—Gopal C. Ray
Attorney, Agent, or Firm—Donald A. Streck; Edward O. Ansell; Elgin Edwards

[57] ABSTRACT

A method and associated apparatus for accessing a plurality of DRAMs in the static column mode by a high performance instruction processor to provide minimum wait state accessing thereby. The method comprises the steps of, having the instruction processor emit each instruction address as an address containing a bank number field, a row address field, and column address field; providing a table for storing a set of open pages being the current row address for each bank where a bank is associated with a respective one of the plurality DRAMs; for each instruction address emitted from the instruction processor, determining whether there is a match between the row address stored in the table and the row address emitted from the instruction processor employing the bank number as an index into the table of open pages; if the two addresses match, continuing the memory access to the indicated bank in a continuing static column mode; and, if the two addresses do not match, overwriting the old address for the indicated bank in the table with the new row address and continuing the memory access by beginning a new static column mode access to the indicated bank. In the preferred embodiment, the method includes, as necessary, aborting the access in progress if the two addresses do not match prior to beginning the new static column mode access to the indicated bank and advising the instruction processor that the access in progress is being aborted and being begun again.

13 Claims, 6 Drawing Sheets

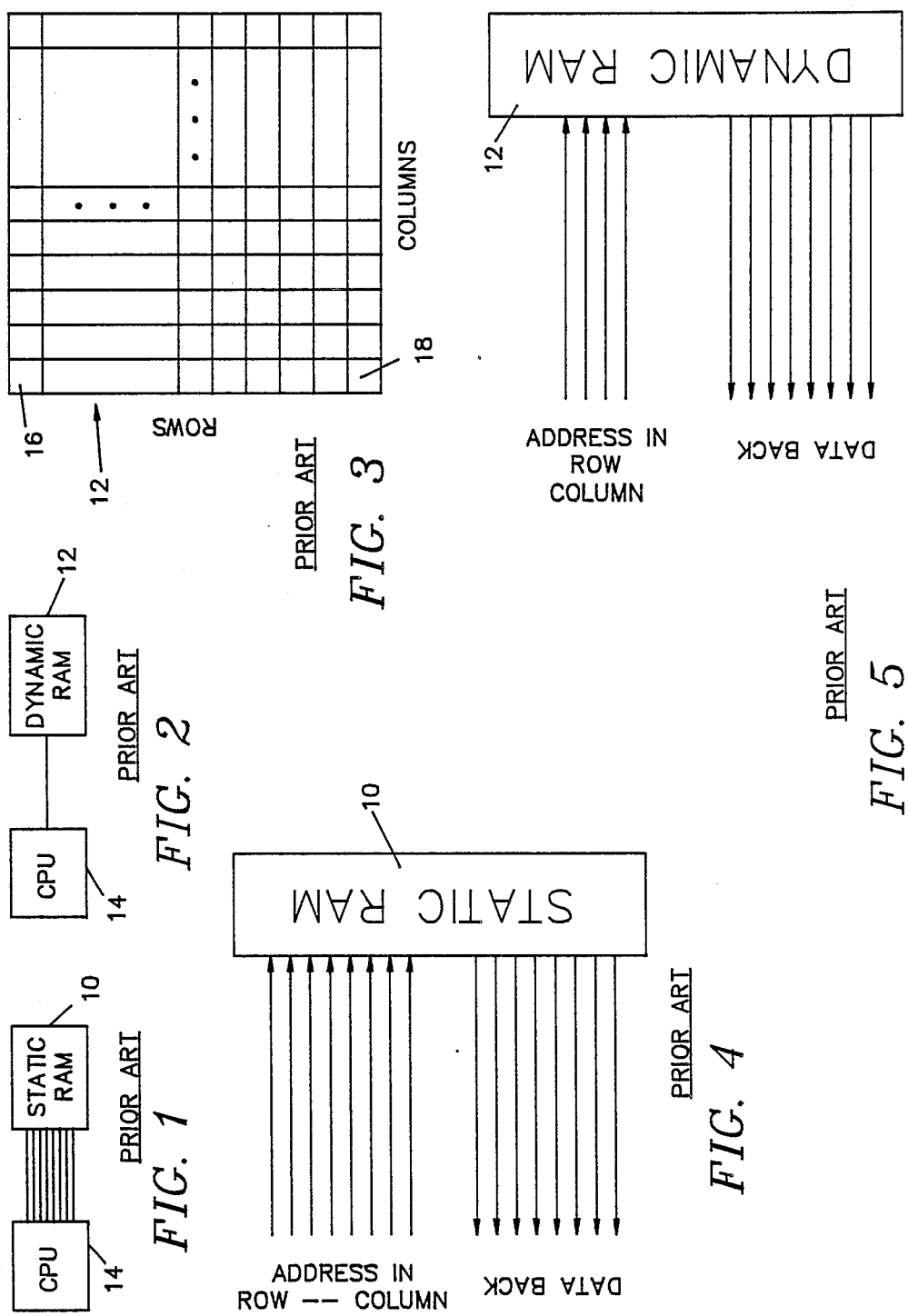

HIGH PERFORMANCE DYNAMIC RAM INTERFACE

BACKGROUND OF THE INVENTION

This invention relates to computer memories and more particularly to a DRAM memory subsystem capable of minimum wait state accessing by a high performance device outputting a series of row and column addresses for data to be accessed comprising, a DRAM comprised of rows and columns and operable in a static column mode in response to address requests asserted at RAS and CAS inputs thereof; and, access optimization logic means operably connected for receiving a first row and column address as output by the device, for asserting the first row and column address at the RAS and CAS inputs, for receiving a second row and column address as output by the device, for changing the column address being asserted at the CAS input to correspond to the second column address, for checking the second row address against the first row address, and for reasserting the second row and column address at the RAS and CAS inputs if the second row address is not the same as the first row address.

As depicted in FIGS. 1 and 2, it is known in the art to employ either a static RAM 10 or a dynamic RAM 12 to serve as a memory subsystem for a central processing unit (CPU) 14 which processes instructions contained in the RAM 10, 12 as well as reading from and writing to that memory. Commercial designs for instruction processors which are used in contemporary general purpose, high performance computing systems, however, require fast random access memory subsystems to sustain maximum performance. The instruction processor provides the memory subsystem with an address which identifies a location in the memory subsystem where data is stored. The memory subsystem must then provide quick access to the location so that the data stored in the location can be read from or written to by the processor. If the memory subsystem is incapable of accessing data at the rate which the processor requires for peak performance, the processor must wait for the memory access operation to complete. The time spent by the processor waiting for data directly decreases the performance of the computing system. This is a classic example of the old adage that a chain is only as strong as its weakest link. No matter how fast the computer processor may be, it can only operate as fast as it can access its data and instructions from memory.

The customary units for specifying the memory access time are clock cycles. The instruction processor executes instructions in one or more clock cycles. State-of-the-art designs such as so-called reduced instruction set computers (RISCs) strive to execute one instruction per clock cycle. Since each load and store instruction requires an access to the memory subsystem, these operations must also complete in one clock cycle if this design objective is to be achieved. For the same reasons, instructions from the memory subsystem must be delivered to the processor for execution at an average rate of one instruction per clock cycle.

A typical value for the clock period of a state-of-the-art design is 50 nanoseconds (ns). For example, the Motorola model 68030 instruction processor chip has a 50 ns clock cycle and the memory cycle time is less than two clock cycles or 100 ns. For the Motorola 68030 to operate without waiting for data, the Motorola company states, "When the MC68030 is operating at high clock frequency, a no-wait-state external memory subsystem will of necessity be composed of static RAMs." (MC68030 User's Manual, C. 1987, Sections 12–14). In other words, the Motorola company, like everyone else skilled in the art, is of the opinion that high performance instruction processors (and other high performance devices having to access memory subsystems) will not operate at their maximum performance capability (i.e. with no waiting for memory accesses) with dynamic random access memory (DRAM) as the memory.

The static RAM (SRAM) is a random access memory which provides access times from as low as 12 ns (but typically 45 ns) for state-of-the-art components. SRAM is built employing memory cells which each require six transistors. In contrast, DRAM is built of cells each requiring a single transistor; but, has a typical access time of 100 ns for state-of-the-art components with a cycle time of 200 ns. The cycle time indicates the maximum rate at which the DRAM can respond to memory access requests. A peculiarity of DRAM memory chips is that the devices require a significant "precharge" time when the row address is changed. Thus, as evidenced by the figures quoted above, DRAM cycle time is typically twice the time required to access the datum. In comparison, SRAM has a cycle time which is only slightly longer than its access time. The primary advantages of the DRAM over the SRAM are density and price; that is, more memory can be placed into the same space with DRAM because of the 6:1 reduction in the number of transistors for each cell of the memory. Obviously, the simpler design also results in a substantial cost reduction as well. Generally speaking, DRAM affords a 4:1 advantage in density and a 5:1 advantage in price. Such an advantage makes the use of DRAM over SRAM very desirable when possible. But, as we have seen, those skilled in the art have considered DRAM as unsuitable for use with high performance devices.

The DRAM market is highly competitive and the manufacturers of DRAM chips have produced novel variations on the customary organization of the DRAM to gain customer acceptance. One common variation is called "static column mode". Internally, as depicted in FIG. 3, a DRAM 12 is organized as a two-dimensional array of rows 16 and columns 18. The memory address employed for reading and writing the DRAM 12 is partitioned into a row address and a column address. With a static RAM 10, the row and column addresses are input in parallel as depicted in FIG. 4. As depicted in FIG. 5, however, in the dynamic RAM 12 the row address is first strobed into the memory device followed by the column address. As depicted in FIG. 6, this is accomplished by the CPU 14 providing its request to address forming logic 20 which, in turn, transmits the address information over the unmultiplexed address line or address bus 22 to a multiplexer (MUX) 24. The MUX 24 transmits the row address and the column address to the DRAM 12. To access another memory location requires both strobes to be removed for a preset time period and then be reapplied in the same sequence, as depicted in FIG. 7. For static column mode operation, the first step remains the same; once the row address has been strobed in, however, any data within the column can be randomly accessed without changing the row and column strobes. The net effect is that any data within the column, called a "page", can be accessed as if the data were stored in SRAM.

The principal application for static column mode operation in DRAMs is to provide copying of data from one page to another page, i.e. with the row address remaining the same, only the column address need be changed. This mode is particularly useful for disk controllers and other peripherals which employ direct memory to memory copy operations. The access and cycle times for DRAM operating in static column mode are competitive with purely static RAM parts.

Wherefore, it is the main object of the present invention to provide an interface and method of operation which will permit DRAM to be employed in place of SRAM with high performance devices without high risk of imposing wait conditions on the devices thereby.

It is another object of the present invention to employ the static column mode of operation in DRAMs in a manner which will provide high performance devices with a high density, low cost memory subsystem having a statistically low probability of requiring the DRAM to change pages.

Other objects and benefits of the present invention will be recognized from the description which follows hereinafter when taken in conjunction with the drawing figures which accompany it.

SUMMARY

The foregoing objects have been achieved in a DRAM memory subsystem having a DRAM comprised of rows and columns and operable in a static column mode in response to address requests from a high performance device outputting a series of row and column addresses for data to be accessed, by the method of operation of the present invention to provide minimum wait state accessing comprising the steps of, beginning each new access request from the device in a continuing static column mode access by only changing the column address; checking the row address being employed in the continuing static column mode access against the row address of the new access request; continuing with the current continuing static column mode access if the row addresses are the same; and, terminating the current continuing static column mode access and beginning a new static column mode access with the row and column addresses of the new access request if the row addresses are not the same.

In the preferred embodiment, the row and column addresses of each access request are asserted at RAS and CAS inputs of a DRAM and the steps comprise, receiving a first row and column address as output by the device; asserting the first row and column address at the RAS and CAS inputs; receiving a second row and column address as output by the device; changing the column address being asserted at the CAS input to correspond to the second column address; checking the second row address against the first row address; and, reasserting the second row and column address at the RAS and CAS inputs if the second row address is not the same as the first row address.

As necessary in the particular application the method also includes advising the device of aborting and retrying an access to the DRAM if the second row address is not the same as the first row address.

The method also is applicable where there are a plurality of the DRAMs each identifiable by a bank number and the device includes a bank address as part of each row and column address. In such case, it additionally comprises the steps of, storing the presently being asserted row address for each bank in a memory table; storing the presently being asserted row address for each bank in the memory table; changing the column address being asserted at the CAS input on the DRAM indicated by the bank address portion of second address from the device to correspond to the second column address; and, checking the second row address against the first row address as stored in the memory table for the bank indicated by the bank address portion of second address from the device.

DESCRIPTION OF THE DRAWINGS

FIG. 1 is a simplified block diagram of a CPU connected to a static RAM as is known in the prior art.

FIG. 2 is a simplified block diagram of a CPU connected to a dynamic RAM as is known in the prior art.

FIG. 3 is a simplified drawing depicting the row and column two-dimensional addressing environment of a RAM as is known in the prior art.

FIG. 4 is a simplified drawing depicting how a static RAM receives its row and column address information in parallel resulting in faster access to the memory as is known in the prior art.

FIG. 5 is a simplified drawing depicting how a dynamic RAM first receives its row address information and then its column address information resulting in slower access to the memory as is known in the prior art.

Figure 6:
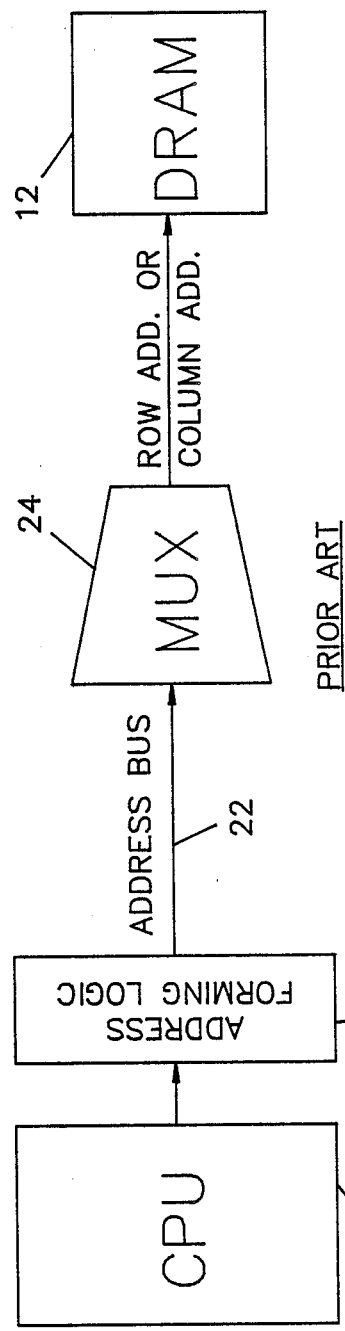
FIG. 6 is a functional block diagram of the typical apparatus and method employed in the prior art to access a dynamic RAM.

DESCRIPTION OF THE PREFERRED EMBODIMENT:

Before beginning the description of the present invention, it should be noted that the description focuses on memory as accessed by an instruction processor or CPU. As those skilled in the art will readily recognize and appreciate, the methods and apparatus of the present invention can be applied equally to any device which accesses memory and desires high performance in conjunction therewith. Therefore, it is applicants' intent that the teachings hereof and the claims appended hereto be given a breadth of interpretation in keeping with the breadth of application of the present invention despite the focus on instruction processors and CPUs.

Broadly stated, the present invention is a mechanism, and associated method of operation, which exploits the fast static RAM aspects of static column mode in DRAM for application in high performance computing systems. The use of the DRAM does not significantly slow the instruction processor. The processor provides the memory subsystem with an address which is partitioned into a row and column address. The row address is strobed into the DRAM chip. Subsequent memory accesses within the same page will result in zero-wait-state accesses. If the memory location requested does not lie within the current page, then the row address is changed and the process is repeated. The preferred implementation uses multiple DRAM chips organized into "banks". For each bank there is one page that is currently accessible. By adding additional banks, more pages are "open" to the processor at any given time such that, statistically, the number of zero-wait-state accesses can only increase.

Whenever the instruction processor accesses data from a page that is not open, the full dynamic RAM cycle must be activated. This activation, of course, will cause wait states to be inserted. The memory subsystem according to the present invention, therefore, does not ensure no-wait-state performance unless the entire program presently operating fits onto the current set of open pages. It should be noted that the static RAM approach suffers from a similar problem, however. Zero-wait-state performance can be achieved only if the entire program fits into the SRAM. If the SRAM is overflowed, then the program must be operated from slower RAM, or the program must be copied into SRAM in overlay portions. To operate out of slower RAM introduces wait states; and, to copy data into SRAM introduces wait states. Those skilled in the art will recognize, therefore, that the present invention operates best in instances where, because of the programs and/or data organization, access to open pages will occur over long sequences and the changing of pages will occur only periodically such that the wait states which occur at the time of page changing will impact the overall operation of the device attached thereto minimally. When organized thus, the overall savings in space and cost far outweigh the statistically minimum amount of wait state time added to the operation of the accessing device as a result. Furthermore, the present invention has an inherent advantage over the static RAM approach in that no copying is involved when one page is closed and another is opened. As a further consideration, statistical evidence known in the art indicates that almost all programs exhibit substantial "locality of reference", i.e. over some time interval some segments of memory are accessed intensively while others are not. In particular, code execution is usually quite sequential and stack operations are extremely localized. References to blocks of data tend to be localized as well since blocks of data are often relatively small. All this is to say that when using the present invention with the "typical" program, stack, and data regions, very little changing of pages is required such that the overall effect of DRAM operating according to the present invention is substantially identical to SRAM which, as will be recalled, costs much more in both dollars and space. In this regard, the freely accessible, multiple pages of the present invention operate substantially identically to so-call "cache memory" and, for that reason, can be thought of as "pseudo cache memory". By way of example, in a tested embodiment of the present invention, the main memory is organized as multiple 1MB banks, e.g. four banks for a 4MB computer. At any moment, each bank of memory may have one 2KB page accessible without requiring a change of the row address of that bank. Overall, a 4MB memory may have four 2KB pages or 8KB of preferentially accessible, i.e. "pseudo cache", DRAM. Of course, the particular pages which are "current" may be changed by providing new row addresses to the banks, but this takes some time. When used with a multiprogramming operating system, the system may preferentially locate codes, stack, and data segments in different banks so as to increase the probability of zero-wait-state operation.

In fairness, it should also be pointed out that while the discussion of the present invention herein talks of keeping addresses asserted until they need to be changed, as those skilled in the art are aware, the static column mode of DRAM can only be maintained for a certain amount of time, typically 100 microseconds. At that time, the address assertions must be remade in the normal manner. At typical contemporary access times, this is adequate for a few hundred DRAM accesses to be made before reassertion is required. Again, the benefits attained far outweigh the limitation so that this is not considered to be a problem.

The mechanism of the present invention in its preferred embodiment is comprised of:

1. A table for storing the set of open pages.
2. Logic which determines whether there is a match between the row address stored in the table and the row address emitted from the instruction processor.
3. Logic to replace an old row address with a new row address.

Figure 8:
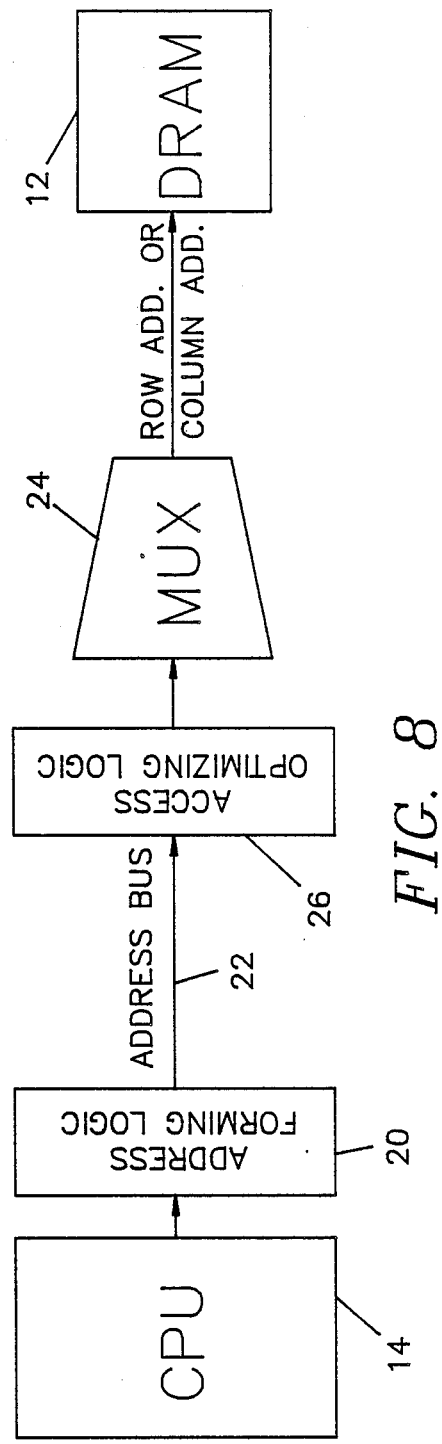
FIG. 8 is a functional block diagram in the manner of FIG. 6 of the apparatus and method employed in the present invention to access a dynamic RAM.

When the instruction processor emits an address, the address is partitioned into three fields: bank number, row address, and column address. The bank number is used as an index into the table of open pages. The output of the table is compared with the row address. If the two addresses match, then the memory access continues in the static column mode. If the two addresses do not match, then the replacement logic is used to overwrite the old address in the table with the new row address. The memory access is then continued and is guaranteed to succeed because of the replacement step. Having thus looked at the present invention on an overview basis, both the apparatus employed and its manner of operation will now be addressed with even greater particularity. As depicted in FIG. 8, the CPU 14 makes its requests for data and instruction transfers from and to the DRAM 12 through address forming logic 20 in the manner of the prior art approach of FIG. 6. In the present invention, however, the output of the address forming logic 20 goes to access optimizing logic 26. The access optimizing logic 26 then makes the request to the DRAM 12 through the MUX 24 as in the prior art. It should be noted, and will be readily recognized and appreciated by those skilled in the art, that while the access optimizing logic 26 of the present invention is shown as a separate entity disposed between the address forming logic 20 and the MUX 24, that logic could be located within the address forming logic 20, in the DRAM, anywhere inbetween, or distributed in portions therebetween, as appropriate and convenient to the implementation. All that is required is that the logical steps being described herein be accomplished some-where between the CPU 12 (or other using device) and the DRAM 12. Also, it will be noted that the logic to be described is in the form of basic flow diagrams which can be implemented in any number of ways well known to those skilled in the art including hardware, software, firmware, etc. In the interest of simplicity and to avoid redundancy, therefore, no details of specific implementations have been included.

Figure 7:
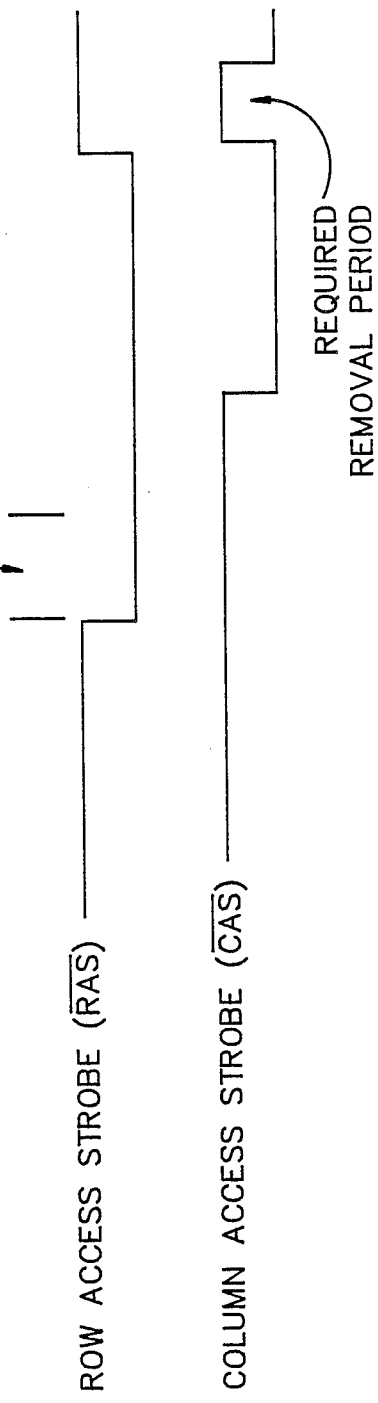
FIG. 7 is a drawing showing the relationship of the access addressing strobe signals in the apparatus and method of FIG. 6.
Figure 9:
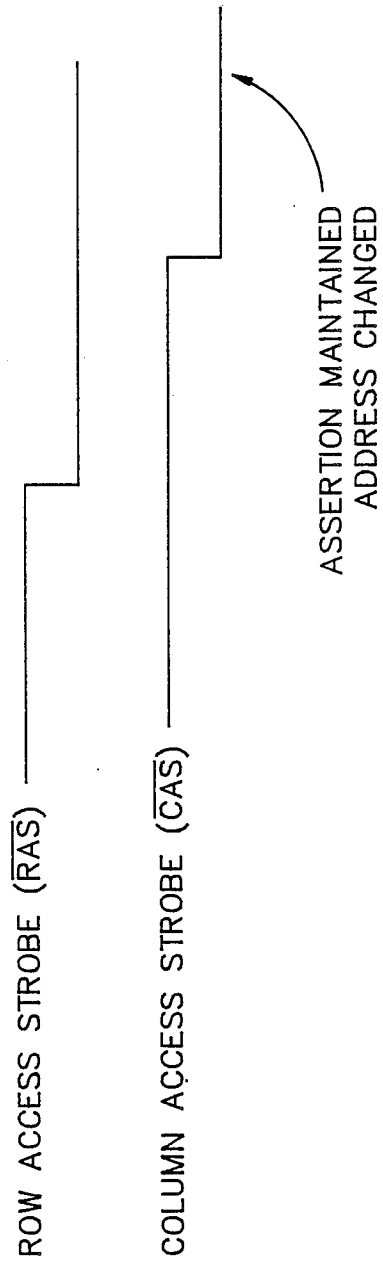
FIG. 9 is a drawing in the manner of FIG. 7 showing the relationship of the access addressing strobe signals in the apparatus and method of the present invention.

As depicted in FIG. 9, the strobe signals as applied in the present invention occur in the same order as in the prior art of FIG. 7; but, in a different manner. The row access strobe (RAS) is applied first followed by the column access strobe (CAS) after the normal delay required by the DRAM 12 being employed. With the present invention, however, the assertion of the RAS and CAS strobes is maintained—only the contents of that assertion, i.e. the column address, changes. It is characteristic of the DRAMs that when an address appears at the address input, the stored data appears at the data output some fixed time later. Thus, when the column address enabled by the continuously asserted CAS strobe is changed, the new data corresponding to the new address will appear at the output at that fixed time later. That, of course, describes a "read" cycle. The static column mode works substantially the same way for a "write" from the CPU to DRAM.

Figure 10:
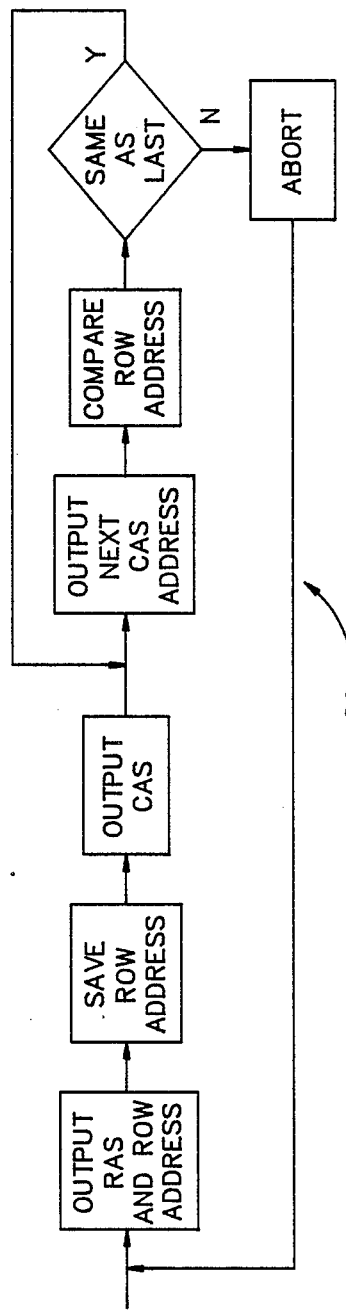
FIG. 10 is a flow chart showing the basic logic accomplished by the access optimizing logic of the present invention.

The basic logic of the access optimizing logic 26 of the present invention is depicted in flowchart form in FIG. 10. As can be seen therein, to begin a memory access sequence, the RAS and row address are output and the row address indicated by the RAS is saved. Thereafter, CAS is output and the next column address is multiplexed onto the DRAM address inputs. That, of course, means that the address indicated by the continuously asserted CAS is changed. Thus, as described above, unless there is a problem, the data for the new column address will appear at the DRAM output a short time later. In the meantime, however, having thus begun the access on the assumption that, in all likelihood, the row address has remained the same (i.e. the access is in the same page of memory), the logic compares the row address of the current request to the row address of the previous request as saved, i.e. the "current" row/page of the selected bank. If they are the same, as they will be most of the time in accesses where returns to output, i.e. change, the next CAS address. In the rare instances where there is a page change and the row addresses do not agree, the logic "aborts" the access and returns to the point in the logic where the RAS is negated and reasserted with a new row address. Note that the concept of "abort" within the logic 26 can take many forms depending upon the memory accessing device with which the present invention and its associated DRAM is being used. In some cases, the cycle can be easily delayed while reasserting a new RAS and CAS. In others, the logic 26 may have to take some affirmative action such as setting a "bad data transfer-retrying" flag, or the like, to the requesting CPU or other device.

Figure 11:
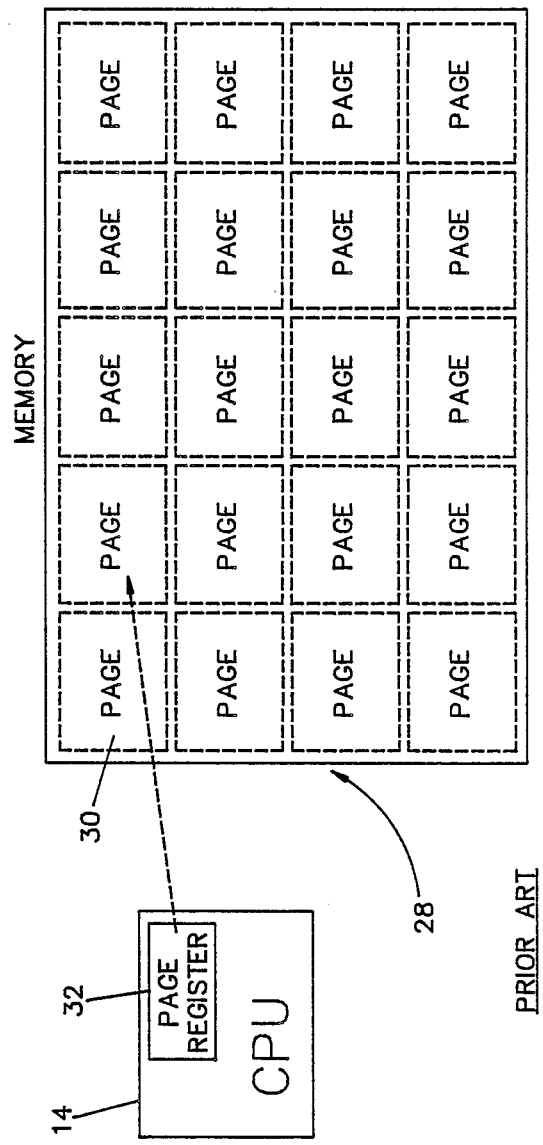
FIG. 11 is a simplified block diagram depicting a prior art approach to a paged memory wherein a single page at a time can be accessed via a page register indicating the base page address.

Before continuing, it should be pointed out that, as depicted in FIG. 11, it is known in the art to have a page-oriented memory 28 wherein the memory 28 can be divided into a plurality of pages 30. This approach was employed, for example, some twenty years ago in the Control Data model 1700 computer, which was a relative-addressed, sixteen bit word length computer, which made it impossible to designate all address locations within the computer's main memory 28 in a single computer word. In that computer, the memory 28 was dividable into pages 30 of a size that could be addressed in total with the available bits and a page register 32 was employed to point to the currently active or "open" page. Actually, the contents of the page register 32 pointed to a center address of an area of the memory 28 to be considered as a page for current accessing purposes. Subsequent accesses to the memory 28 (read, write, and next instruction address) were to the address contained in the page register 32 plus a relative offset in the range of plus or minus 7FFF (hexadecimal) as could be designated in one sixteen bit computer word.

Figure 12:
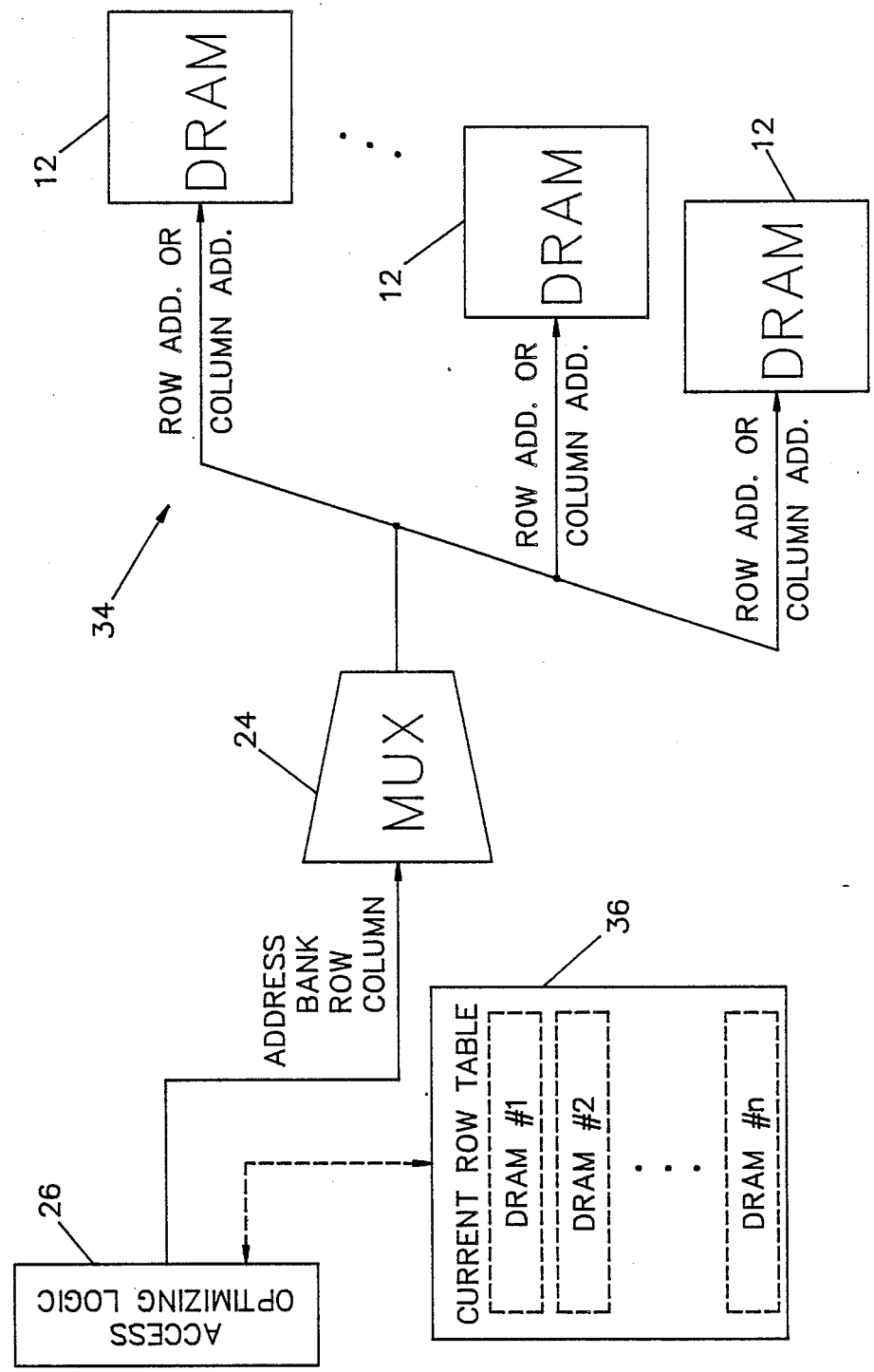
FIG. 12 is a functional block diagram of the preferred multi-bank configuration of multiple dynamic RAMs of the present invention wherein multiple "pages" of memory can be opened simultaneously for increased access speed.
Figure 13:
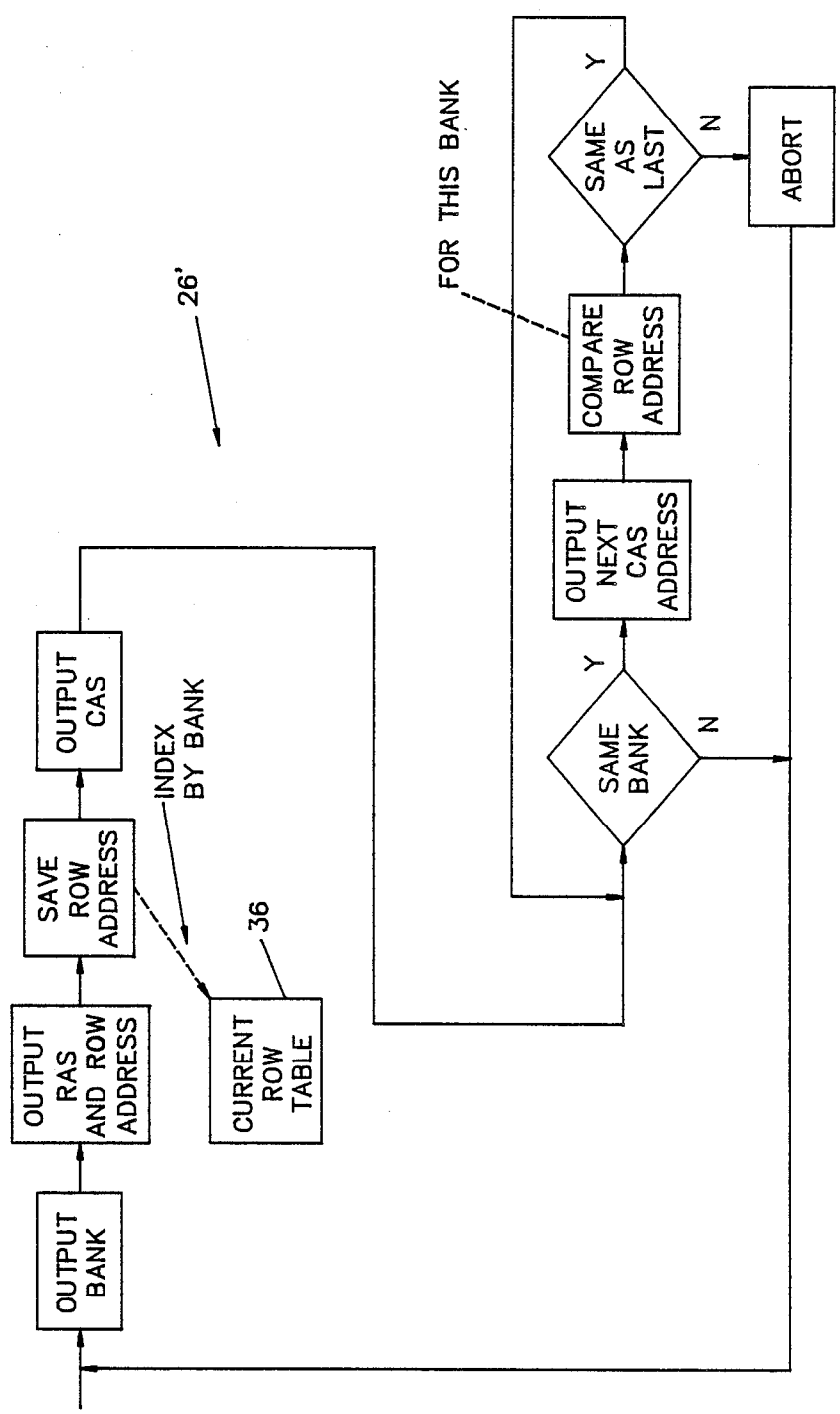
FIG. 13 is a flow chart showing the basic logic accomplished by the access optimizing logic of the present invention in its preferred embodiment employing the multi-bank configuration of multiple dynamic RAMs of FIG. 12.

The above-described very simplified prior art concept of paging is greatly restructured, improved and enhanced by the preferred embodiment of the present invention as depicted in FIG. 12. As shown therein, a plurality of DRAMs 12 are employed wherein each DRAM 12 is referred to as a "bank" of memory. The addresses into the overall memory, generally indicated as 34, comprising the multiple DRAMs 12, therefore, include a bank indicator along with the row and column indicators. Additionally, the saving of the current row address is accomplished by the access optimizing logic 26 through the use of a current row table 36 in volatile memory containing the currently open page (i.e. row number) within each "bank" of DRAM 12. The flowchart for the logic 26 to implement this approach is contained in FIG. 13. As depicted therein, the logic outputs the bank identifier, the row address and RAS and then saves the row address in the current row table 36 indexed by the bank number. It thereafter outputs the column address and CAS and then the next column address as in the previous embodiment of the present invention described in detail above. Again in similar manner, it compares the row address as output to the "current" row as last output. In this case, however, the logic uses the bank number as an index into the current row table 36 so as to pick up the current row for the bank being accessed. As before, it either continues (if a match) or aborts and reaccesses (if no match).

Thus, it can be seen that, for most applications, the present invention has met its stated objectives by providing a method and associated apparatus for allowing DRAM to be employed in high performance application with little or no degradation of performance (through waiting for memory accesses) by the associated device.

Wherefore, having thus described the present invention, what is claimed is:

1. A DRAM memory subsystem capable of minimum wait state accessing by a high performance device accessing outputting a series of row and column addresses for data to be accessed comprising:
   (a) a DRAM comprised of rows and columns and operable in a static column mode in response to address requests asserted at RAS and CAS inputs thereof; and,
   (b) access optimization logic means operably connected for receiving a first row and column address as output by the device, for asserting said first row and column address at said RAS and CAS inputs, for receiving a second row and column address as output by the device, for changing the column address being asserted at said CAS input to correspond to said second column address, for checking said second row address against said first row address, and for reasserting said second row and column address at said RAS and CAS inputs if said second row address is not the same as said first row address.

2. The DRAM memory subsystem of claim 1 wherein:
said access optimization logic means includes means for aborting an access to said DRAM prior to reasserting said second row and column address at said RAS and CAS inputs if said second row address is not the same as said first row address.

3. The DRAM memory subsystem of claim 1 wherein there are a plurality of said DRAMs each identifiable by a bank number and the device includes a bank address as part of each row and column address for data to be accessed and additionally comprising:
  (a) memory table means for storing the presently being asserted row address for each bank; and wherein,
  (b) said access optimization logic means includes means for storing the presently being asserted row address for each bank in said memory table means, for changing the column address being asserted at said CAS input on said DRAM indicated by the bank address portion of second address from the device to correspond to said second column address, and for checking said second row address against said first row address as stored in said memory table means for the bank indicated by the bank address portion of second address from the device.

4. The method of operating a DRAM memory subsystem having a DRAM comprised of rows and columns and operable in a static column mode in response to address requests asserted at RAS and CAS inputs thereof to provide minimum wait state accessing by a high performance memory accessing device outputting a series of row and column addresses for data to be accessed comprising the steps of:
  (a) receiving a first row and column address as output by the device;
  (b) asserting the first row and column address at the RAS and CAS inputs;
  (c) receiving a second row and column address as output by the device;
  (d) changing the column address being asserted at the CAS input to correspond to the second column address;
  (e) checking the second row address against the first row address; and,
  (f) reasserting the second row and column address at the RAS and CAS inputs if the second row address is not the same as the first row address.

5. The method of operating a DRAM memory subsystem of claim 4 including the step of:
aborting an access to the DRAM prior to reasserting the second row and column address at the RAS and CAS inputs if the second row address is not the same as the first row address.

6. The method of operating a DRAM memory subsystem of claim 4 wherein there are a plurality of the DRAMs each identifiable by a bank number and the device includes a bank address as part of each row and column address for data to be accessed and additionally comprising the steps of:
  (a) storing the presently being asserted row address for each blank in a memory table;
  (b) changing the column address being asserted at the CAS input on the DRAM indicated by the bank address portion of a second address from the device to correspond to the second column address; and,
  (c) checking the second row address against the first row address as stored in the memory table for the bank indicated by the bank address portion of second address from the device.

7. The method of accessing a plurality of DRAMs in the static column mode by an instruction processor to provide minimum wait state accessing thereby comprising the steps of:
  (a) having the instruction processor emit each instruction address as an address containing a bank number field, a row address field, and column address field;
  (b) providing a table for storing a set of open pages being the current row address for each bank where a bank is associated with a respective one of the plurality of DRAMs;
  (c) for each instruction address emitted from the instruction processor to effect a memory access in a static column mode, determining whether there is a match between the row address stored in the table and the row address emitted from the instruction processor employing the bank number as an index into the table of open pages;
  (d) if the two addresses match, continuing the memory acess to an indicated bank in a continuing static column mode using the row and column addresses as presently asserted from the instruction address emitted from the instruction processor; and,
  (e) if the two addresses do not match, overwriting the old address for the indicated bank in the table with the new row address and continuing the memory acess by beginning a new static column mode access to the indicated bank by reasserting the row and column addresses from the instruction address emitted from the instruction processor.

8. The method of claim 7 and additionally comprising the step of:
aborting the access in progress if the two addresses do not match prior to beginning the new static column mode access to the indicated bank.

9. The method of claim 8 and additionally comprising the step of:
advising the instruction processor that the access in progress is being aborted and being begun again.

10. In a DRAM memory subsystem having a DRAM comprised of rows and columns and operable in a static column mode in response to address requests from a high performance memory accessing device outputting a series of row and column addresses for data to be accessed, the method of operation to provide minimum wait state accessing comprising the steps of:
  (a) beginning each new access request from the device in a continuing static column mode access by only changing the column address;
  (b) checking the row address being employed in the continuing static column mode access against the row address of the new access request;
  (c) continuing with the current continuing static column mode access if the row addresses are the same; and,
  (d) terminating the current continuing static column mode access and beginning a new static column mode access with the row and column addresses of the new access request if the row addresses are not the same.

11. The improved method of operation of a DRAM memory subsystem of claim 10 wherein the row and column addresses of each access request are asserted at RAS and CAS inputs of a DRAM and the steps comprise:
- (a) receiving a first row and column address as output by the device;
- (b) asserting the first row and column address at the RAS and CAS inputs;
- (c) receiving a second row and column address as output by the device;
- (d) changing the column address being asserted at the CAS input to correspond to the second column address;
- (e) checking the second row address against the first row address; and,
- (f) reasserting the second row and column address at the RAS and CAS inputs if the second row address is not the same as the first row address.

12. The improved method of operation of a DRAM memory subsystem of claim 11 including the additional step of:
- advising the device of aborting and retrying an access to the DRAM if the second row address is not the same as the first row address.

13. The improved method of operation of a DRAM memory subsystem of claim 11 wherein there are a plurality of the DRAMs each identifiable by a bank number and the device includes a bank address as part of each row and column address for data to be accessed and additionally comprising the steps of:
- (a) storing the presently being asserted row address for each bank in a memory table;
- (b) changing the column address being asserted at the CAS input on the DRAM indicated by the bank address portion of second address from the device to correspond to the second column address; and,
- (c) checking the second row address against the first tow address as stored in the memory table for the bank indicated by the bank address portion of second address from the device.

* * * * *